(12) United States Patent
Park

(10) Patent No.: US 8,174,637 B2
(45) Date of Patent: May 8, 2012

(54) THIN-FILM TRANSISTOR SUBSTRATE COMPRISING A REPAIR PATTERN

(75) Inventor: Yong-Eun Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 368 days.

(21) Appl. No.: 12/405,657

(22) Filed: Mar. 17, 2009

(65) Prior Publication Data

US 2009/0230398 A1 Sep. 17, 2009

(30) Foreign Application Priority Data

Mar. 17, 2008 (KR) .................. 10-2008-0024434

(51) Int. Cl.
G02F 1/1333 (2006.01)
G02F 1/1343 (2006.01)
G02F 1/13 (2006.01)

(52) U.S. Cl. ............................ 349/55; 349/54; 349/192
(58) Field of Classification Search .............. 349/54–55, 349/192
See application file for complete search history.

(56) References Cited

U.S. PATENT DOCUMENTS 6,448,579 B1 * 9/2002 Lim et al. ................... 257/59
2006/0028592 A1 * 2/2006 Lai ................................ 349/42
2006/0290858 A1 * 12/2006 Lai ............................... 349/139
2009/0015746 A1 * 1/2009 Te-Chen et al. .............. 349/42

FOREIGN PATENT DOCUMENTS

| JP | 2004070182 | 3/2004 |
| KR | 1020020087738 A | 11/2002 |
| KR | 1020070066264 A | 6/2007 |

* cited by examiner

Primary Examiner — Mark Robinson
Assistant Examiner — Charles Chang
(74) Attorney, Agent, or Firm — Cantor Colburn LLP

(57) ABSTRACT

A thin-film transistor substrate includes; gate lines which extend in a first direction, the gate lines including a first gate line and a second gate line, the first gate line disposed adjacent to and previous to the second gate line, data lines which are insulated from the gate lines and extend in a second direction perpendicular to the first direction, a pixel electrode formed in a region where the first gate line and the second gate lines cross the data lines and connected to the second gate line, and a repair pattern which at least partially overlaps the first gate line, the repair pattern comprising a plurality of connection patterns, wherein the connection patterns extend from the pixel electrode in the second direction toward the first gate line, have a predetermined width measured in the first direction, and are arranged at predetermined intervals along the first direction.

21 Claims, 5 Drawing Sheets

THIN-FILM TRANSISTOR SUBSTRATE COMPRISING A REPAIR PATTERN

This application claims priority to Korean Patent Application No. 10-2008-0024434, filed on Mar. 17, 2008, and all the benefits accruing therefrom under 35 U.S.C. §119, the contents of which in its entirety are herein incorporated by reference.

BACKGROUND OF THE INVENTION

1. Field of the Invention

The present invention relates to a thin-film transistor ("TFT") substrate and a method of repairing the same, and more particularly, to a TFT substrate and a method of repairing the same, in which a defective pixel can be repaired while additional capacitance is substantially reduced and/or effectively prevented.

2. Description of the Related Art

Liquid crystal displays ("LCDs") are a type of widely-used flat panel display ("FPD"). An LCD typically includes a thin-film transistor ("TFT") substrate on which gate lines, data lines, pixel electrodes and TFTs, for example, are formed, a color filter substrate on which common electrodes and color filters are formed, a liquid crystal display panel which includes a liquid crystal layer between the TFT substrate and the color filter substrate, and a driver which drives the liquid crystal display panel. In operation, the LCD applies voltages to the pixel electrodes and the common electrodes and thus generates an electric field in the liquid crystal layer therebetween. An alignment of liquid crystal molecules in the liquid crystal layer is controlled by the generated electric field, and the LCD thereby controls a polarization of incident light. As a result, a desired image is displayed on the LCD.

In a manufacturing process, after modules of an LCD are completed, a test pattern is displayed on a liquid crystal display panel to determine whether there are defective pixels present in the liquid crystal display panel. If a defective pixel is detected, it is repaired.

In general, defects found in liquid crystal display panels are classified as spot defects (such as color defects of pixels, bright-spot defects and dark-spot defects) and line defects caused by short circuits between gate lines and adjacent data lines. A dark-spot defect occurs when a region appears dark at a high grayscale level, e.g., in a white state, due to leakage of light. A bright-spot defect occurs when a region appears bright at a low grayscale level, e.g., in a black state, due to leakage of light.

Human eyes are more sensitive to bright-spot defects in a dark state than dark-spot defects in a bright state. Thus, a stricter standard is typically applied when determining whether a liquid crystal display panel has bright-spot defects than when determining whether the liquid crystal display panel has dark-spot defects.

Generally, a bright-spot defect occurs when a conductive material remaining between a data line and a pixel electrode causes an electrical short circuit therebetween, when a short circuit forms between a pixel electrode and a common electrode or when a connection between a pixel electrode and a TFT fails, for example.

To repair bright-spot defects, a protrusion pattern may be formed to protrude from each pixel electrode. In this case, the protrusion pattern has a predetermined width and height and is formed to overlap a preceding gate line. In addition, a protrusion pattern in an LCD of the prior art has a substantially rectangular or square shape of a predetermined size. As a result, a drain electrode of a TFT in a defective cell having a bright-spot defect, for example, may be opened, and a laser beam is irradiated to a protruding portion of a corresponding pixel electrode to form a short circuit between the pixel electrode having the defective cell and an adjacent gate line.

When a protrusion pattern of a pixel electrode is formed to overlap a preceding gate line, as described above, additional capacitance (as well as liquid crystal capacitance and storage capacitance) is created in each pixel. The additional capacitance increases the overall capacitance of each pixel, which, in turn, increases a gate load of the liquid crystal display panel which has been repaired. As a result, a gate signal is delayed, and image quality of the LCD deteriorates.

BRIEF SUMMARY OF THE INVENTION

Exemplary embodiments of the present invention provide a thin-film transistor ("TFT") substrate, which includes a repair pattern to reduce or prevent additional capacitance, and a method of repairing the TFT substrate using the same.

Alternative exemplary embodiments of the present invention provide a TFT substrate in which a pixel electrode and a repair pattern are spaced apart from each other to prevent the generation of additional capacitance, and a method of repairing the TFT substrate using the same.

Alternative exemplary embodiments of the present invention further provide a TFT substrate in which a pixel electrode and a repair pattern are partially connected to each other to reduce additional capacitance, and a method of repairing the TFT substrate using the same.

According to an exemplary embodiment of the present invention, a TFT substrate includes: gate lines which extend in a first direction, the gate lines including a first gate line and a second gate line, the first gate line disposed adjacent to and previous to the second gate line; data lines which are insulated from the gate lines and extend in a second direction perpendicular to the first direction; a pixel electrode formed in a region where the first gate line and the second gate line cross the data lines and connected to the second gate line; and a repair pattern which at least partially overlaps the first gate line, the repair pattern comprising a plurality of connection patterns, wherein the connection patterns extend from the pixel electrode in the second direction toward the first gate line, the connection patterns have a predetermined width measured in the first direction, and the connection patterns are arranged at predetermined intervals along the first direction.

A width, measured in the second direction, of an overlapping region of the gate lines which overlaps the repair pattern may be one of greater than a width, measured in the second direction, of a region of the gate lines which does not overlap the repair pattern, and less than the width, measured in the second direction, of the region of the gate lines which does not overlap the repair pattern.

The pixel electrode may be aligned with a side of the overlapping region proximate to the first gate line.

A portion of the pixel electrode which is aligned with the overlapping region may protrude away from the pixel electrode toward the overlapping region.

The TFT substrate according to an exemplary embodiment of the present invention may further include an auxiliary repair pattern, wherein the auxiliary repair pattern is formed between the overlapping region of the gate lines and the repair pattern, is insulated from the overlapping region of the gate lines and the repair pattern, and at least partially overlaps the overlapping region of the gate lines and the repair pattern.

The auxiliary repair pattern may be formed in a same layer of the TFT substrate as the data lines.

According to an alternative exemplary embodiment of the present invention, a TFT substrate includes: gate lines which extend in a first direction, the gate lines including a first gate line and a second gate line, the first gate line disposed adjacent to and previous to the second gate line; data lines which are insulated from the gate lines and extend in a second direction perpendicular to the first direction; a pixel electrode formed in a region where the first gate line and the second gate line cross the data lines and connected to the second gate line; and a repair pattern which is spaced apart from the pixel electrode, the repair pattern comprising a plurality of separation patterns, wherein the separation patterns have a predetermined width measured in the first direction, and the separation patterns are arranged at predetermined intervals along the first direction.

The separation pattern may have the shape of an island

A width, measured in the second direction, of an overlapping region of the gate lines which overlaps the repair pattern may be one of greater than a width, measured in the second direction, of a region of the gate lines which does not overlap the repair pattern, and less than the width, measured in the second direction, of the region of the gate lines which does not overlap the repair pattern.

A portion of the pixel electrode not connected to the repair pattern may be spaced apart from the overlapping region.

A portion of the pixel electrode may protrude toward the overlapping region of the gate lines.

The TFT substrate may further include an auxiliary repair pattern formed between the overlapping region of the gate lines and the repair pattern, the auxiliary repair pattern may be insulated from the overlapping region of the gate lines and the repair pattern, and at least partially overlaps the overlapping region of the gate lines and the repair pattern.

The auxiliary repair pattern may be formed in a same layer of the TFT substrate as the data lines.

The repair pattern may at least partially overlap the first gate lien, the repair pattern comprising a plurality of patterns, wherein the patterns have a shape of connection patterns and separation patterns.

The connection pattern may extend from the pixel electrode in the second direction toward the first gate line.

The separation patterns may have a shape of island.

A width, measured in the second direction, of an overlapping region of the gate lines which overlaps the repair pattern is one of greater than a width, measured in the second direction, of a region of the gate lines which does not overlap the repair pattern, and less than the width, measured in the second direction, of the region of the gate lines which does not overlap the repair pattern.

The pixel electrode may be partially spaced apart from the overlapping region of the gate lines.

A portion of the pixel electrode may partially protrude toward the overlapping region of the gate lines.

The thin-film transistor substrate may further include: an auxiliary repair pattern, wherein the auxiliary repair pattern is formed between the overlapping region of the gate lines and the repair pattern, the auxiliary repair pattern is insulated from the overlapping region of the gate lines and the repair pattern, and the auxiliary repair pattern at least partially overlaps the overlapping region of the gate lines and the repair pattern.

The auxiliary repair pattern may be formed in a same layer as the data lines.

According to another alternative exemplary embodiment of the present invention a method of repairing a TFT substrate is provided, the method including; providing a TFT substrate including a first gate line and a second gate line each extending in a first direction, data lines insulated from the first gate line and the second gate line by a gate insulating film and extending in a second direction perpendicular to the first direction, a pixel electrode connected to the second gate line and formed on a passivation layer in a region where the first gate line and the second gate line cross the data lines, and a repair pattern formed from the pixel electrode toward the first gate line and at least partially overlapping the first gate line, irradiating a laser beam onto the repair pattern to form a hole in the gate insulating film and the passivation layer directly under the repair pattern, melting the repair pattern with the laser beam to form a melted repair pattern, and short circuiting the first gate line to the pixel electrode by flowing the melted repair pattern into the hole.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
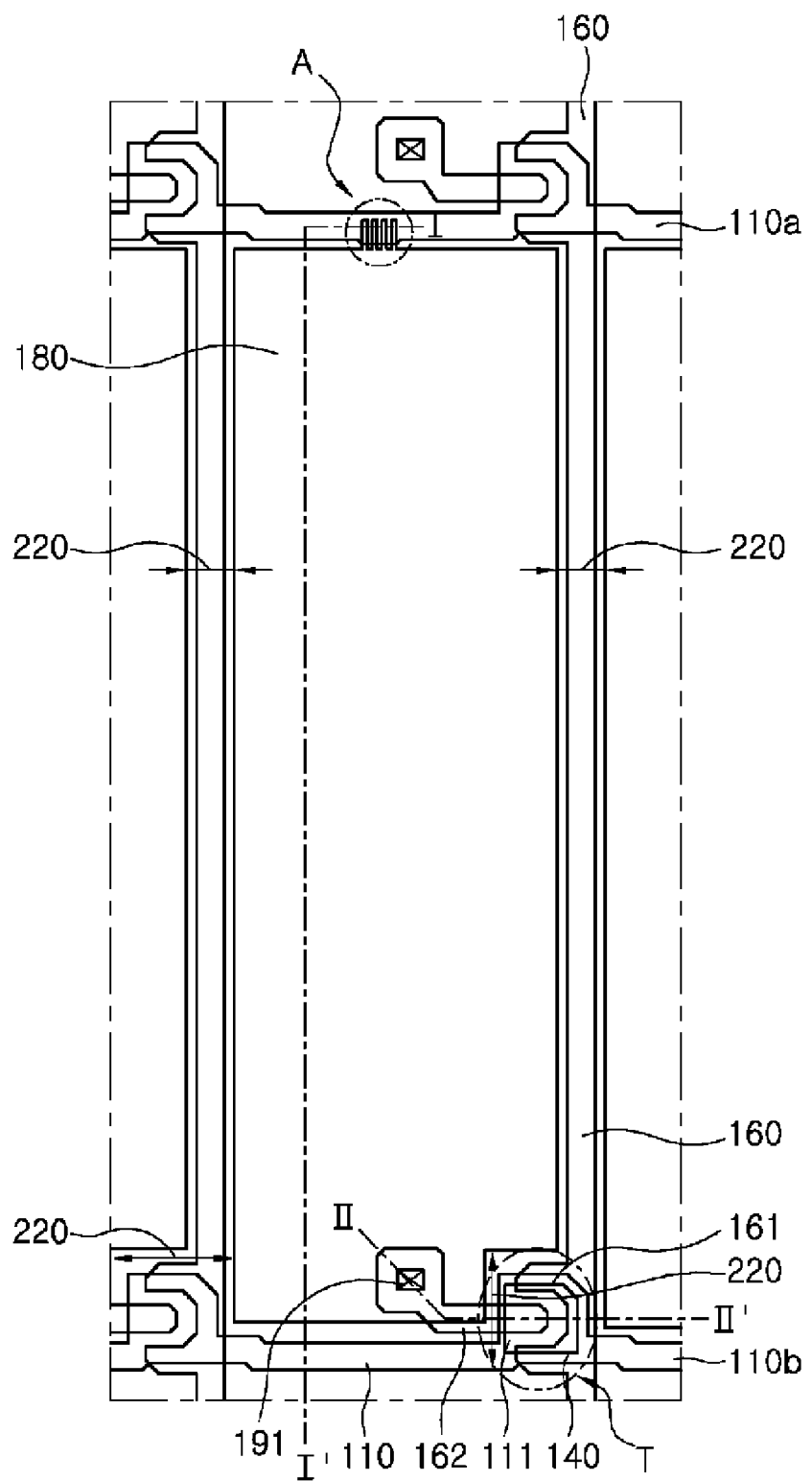
FIG. 1 is a plan view of a liquid crystal display ("LCD"), which includes a thin-film transistor ("TFT") substrate having a repair pattern, according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

Figure 2:
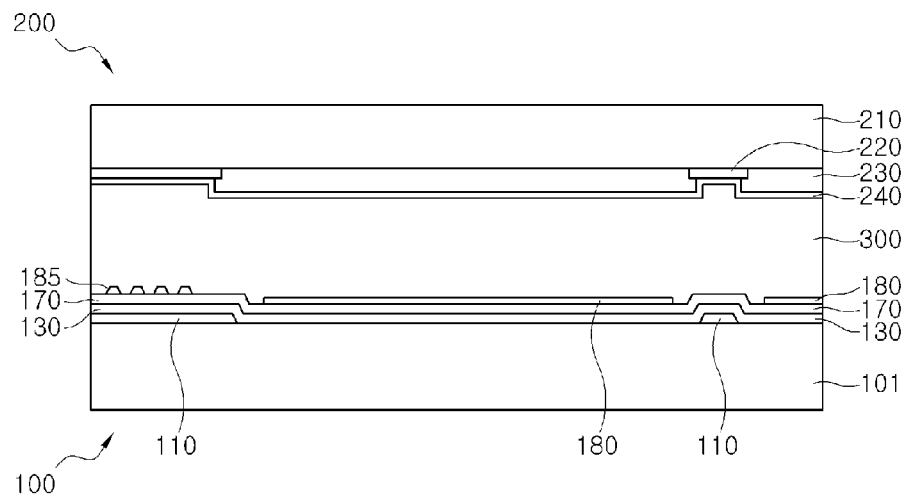
FIG. 2 is a partial cross-sectional view taken along line I-I' of FIG. 1.
Figure 3:
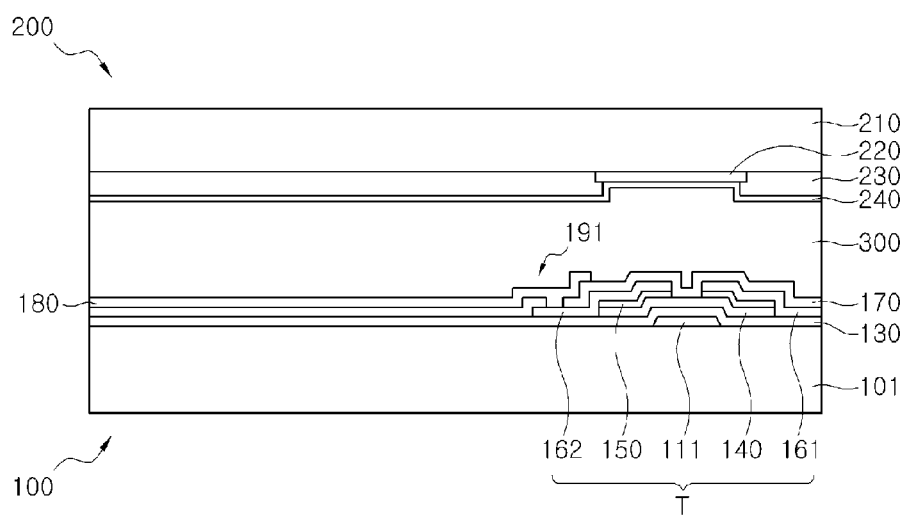
FIG. 3 is a partial cross-sectional view taken along line II-II' of FIG. 1.
Figure 4:
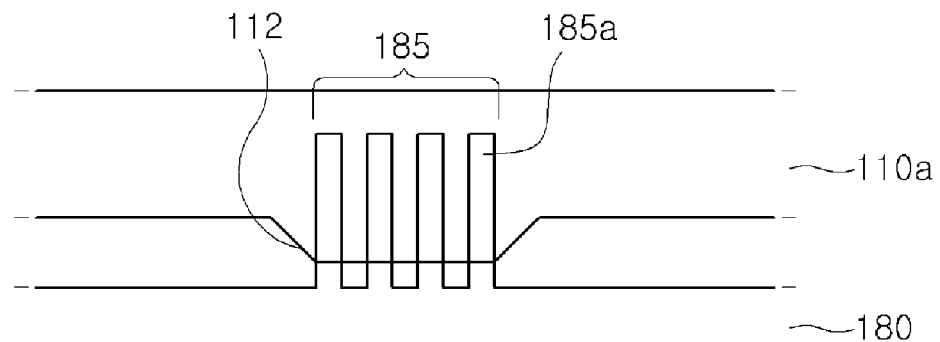
FIG. 4 is an enlarged view of portion A of FIG. 1.

FIG. 1 is a plan view of a liquid crystal display ("LCD"), which includes a thin-film transistor ("TFT") substrate having a repair pattern according to an exemplary embodiment of the present invention. FIG. 2 is a partial cross-sectional view taken along line I-I' of FIG. 1. FIG. 3 is a partial cross-sectional view taken along line II-II' of FIG. 1. FIG. 4 is an enlarged view of portion A of FIG. 1.

Referring to FIGS. 1 through 4, an LCD according to an exemplary embodiment of the present invention includes a TFT substrate 100, a color filter substrate 200 and a liquid crystal layer 300 interposed between the TFT substrate 100 and the color filter substrate 200. The TFT substrate 100 includes a plurality of gate lines 110, which includes a first gate line 110a and a second gate line 110b, a plurality of data lines 160, a passivation layer 170, a pixel electrode 180 and a repair pattern 185. The color filter substrate 200 includes a color filter 230 and a common electrode 240.

The TFT substrate 100 includes the first gate line 110a and the second gate line 110b, the plurality of data lines 160, the pixel electrode 180, the repair pattern 185 and a TFT T on a first insulating substrate 101. The first gate line 110a and the second gate line 110b extend in a first direction, e.g., a substantially horizontal direction as shown in FIG. 1, and data lines 160 of the plurality of data lines 160 extend in a second direction substantially perpendicular to the first direction such that the data lines 160 intersect the first gate line 110a and the second gate line 110b, as shown in FIG. 1. In an exemplary embodiment, the pixel electrode 180 is formed in a pixel region defined by the first gate line 110a, e.g., a previous gate line 110a, and the second gate line 110b, e.g., a current gate line 110b, and adjacent data lines 160. As best shown in FIG. 4, at least a portion of the repair pattern 185 overlaps at least a portion of the first gate line 110a, as will be described in further detail below. In addition and referring again to FIG. 1, the TFT T is connected to the first gate line 110a, a data line 160 and the pixel electrode 180.

Specifically, the first gate line 110a and the second gate line 110b extend in the first direction, and a portion of each of the first gate line 110a and the second gate line 110b protrudes upward or downward, e.g., in the second direction, to form a gate electrode 111. More specifically, as shown in FIG. 1, a portion of the first gate line 110a, proximate to the repair pattern 185, protrudes downward in the second direction from the first gate line 110a toward the pixel electrode 180. Further, the first gate line 110a and the second gate line 110b include an overlapping region 112 (FIG. 4) disposed adjacent to the protruding portion thereof (proximate to the repair pattern 185) and which overlaps the repair pattern 185. In addition, a width of the overlapping region 112 is greater than widths of other regions of each of the first gate line 110a and the second gate line 110b longitudinally aligned in the first direction, e.g., greater than widths of other portions of the first gate line 110a and the second gate line 110b not including the gate electrodes 111 thereof. Put another way, a side of the overlapping region 112 of each of the first gate line 110a and the second gate line 110b protrudes toward an adjacent pixel region, e.g., toward the pixel electrode 180 in a subsequent adjacent pixel region. Therefore, the overlapping region 112 is wider than other regions of each of the first gate line 110a and the second gate line 110b. Thus, a location to which a laser beam is irradiated is easily detected in the LCD according to an exemplary embodiment of the present invention, since the overlapping region 112 of each of the first gate line 110a and the second gate line 110b is wider than other regions thereof. In addition, in an exemplary embodiment, the first gate line 110a and the second gate line 110b may be bent in a predetermined manner, as shown in FIG. 1. It will be noted that alternative exemplary embodiments are not limited to the foregoing description. Rather, in an alternative exemplary embodiment of the present invention, the overlapping region 112 of each of the first gate line 110a and the second gate line 110b may be narrower than the other regions thereof.

A storage electrode line (not shown), disposed separate from each, e.g., spaced apart from, of the first gate line 110a and the second gate line 110b, may extend between and be aligned substantially parallel to the first gate line 110a and the second gate line 110b. The storage electrode line (not shown) may be located midway between, e.g., equal distances from the first gate line 110a and the second gate line 110b, or, alternatively, may be located adjacent, e.g., closer to, to one of the first gate line 110a and the second gate line 110b. In addition, the storage electrode line (not shown) may be formed in a same manufacturing process to have a same thickness and width as the first gate line 110a and the second gate line 110b. Alternatively, the storage electrode line (not shown) may be formed to have a different width from that of the first gate line 110a and the second gate line 110b.

Each of the first gate line 110a and the second gate line 110b and the storage electrode line (not shown) may be made of at least one of aluminum (Al), copper (Cu), neodymium (Nd), silver (Ag), chromium (Cr), titanium (Ti), tantalum (Ta) and molybdenum (Mo), or an alloy thereof, for example, but alternative exemplary embodiments of the present invention are not limited thereto. Each of the first gate line 110a and the second gate line 110b and the storage electrode line (not shown) may include a single layer or, alternatively, multiple layers and may also be buried in, e.g., disposed in and/or covered by, the first insulating substrate 101.

A gate insulating film 130 is formed on the first insulating substrate 101 having the first gate line 110a and the second gate line 110b and the storage electrode line (not shown). In an exemplary embodiment, the gate insulating film 130 is a single layer or, alternatively, may be a multiple layer structure formed of an inorganic insulating film such as silicon dioxide ("SiO$_2$") or silicon nitride ("SiNx"), for example.

An active layer 140, made of a first semiconductor material, is formed on the gate insulating film 130 disposed on the gate electrode 111. An ohmic contact layer 150, made of a second semiconductor material, is formed on the active layer 140. In an exemplary embodiment, the first semiconductor material includes amorphous silicon ("a-Si"), and the second semiconductor material includes silicide or n+ hydrogenated amorphous silicon doped with n-type impurities in high concentration, but alternative exemplary embodiments of the present invention are not limited thereto.

The data lines 160 are formed on a surface of the first insulating substrate 101 having the gate insulating film 130, the active layer 140 and the ohmic contact layer 150. The data lines 160 extend in the second direction which intersects the first gate line 110a and the second gate line 110b, e.g., in a substantially vertical direction, as shown in FIG. 1. A source electrode 161 protrudes from each of the data lines 160 in the first direction, and a drain electrode 162 is separated from, e.g., spaced apart from, the source electrode 161 by a predetermined gap. At least a part of each of the source electrode 161 and the drain electrode 162 is formed on the active layer 140 and the ohmic contact layer 150. In an exemplary embodiment, the data lines 160, each including the source electrode 161 and the drain electrode 162, are formed using a same material used to form the first gate line 110a and the second gate line 110b and the storage electrode line, as described in greater detail above. Further, the data lines 160 may be a single layer or, alternatively, multiple layers. In addition, the data lines 160 may be bent in a predetermined manner, as shown in FIG. 1.

The TFT T allows a pixel signal, transmitted to each of the data lines 160 in response to a signal transmitted to each of the first gate line 110a and the second gate line 110b, to be charged in the pixel electrode 180. Therefore, as shown in FIG. 1, the TFT T includes the gate electrode 111 connected to the first gate line 110a, the source electrode 161 connected to the data line 160, the drain electrode 162 connected to the pixel electrode 180, as well as the gate insulating film 130, the active layer 140 and the ohmic contact layer 150 sequentially formed between the gate electrode 111 and each of the source electrode 161 and the drain electrode 162. In an exemplary embodiment of the present invention, the ohmic contact layer 150 is formed on all regions of the active layer 140, excluding a channel region disposed substantially above the gate electrode 111 and between the source electrode 161 and the drain electrode 162.

The passivation layer 170 is formed on the TFT T and the data lines 160. In an exemplary embodiment, the passivation layer 170 may include a photosensitive organic material, a low-dielectric constant insulating material formed by plasma enhanced chemical vapor deposition ("PECVD"), or, alternatively, an inorganic material such as SiNx, for example, but alternative exemplary embodiments are not limited thereto. As shown in FIG. 3, a portion of the passivation layer 170 is removed to form a contact hole 191 therethrough to partially expose the drain electrode 162.

The pixel electrode 180 is formed on the passivation layer 170 in each pixel region, which is defined by the first gate line 110a and the second gate line 110b and the data lines 160 in an exemplary embodiment of the present invention. The pixel electrode 180 is connected to the drain electrode 162 through the contact hole 191. In addition, the pixel electrode 180 is separate from, e.g., spaced apart from, the first gate line 110a, the second gate line 110b and the data lines 160, and is also spaced apart from the gate electrode 111 and the source electrode 161. However, the pixel electrode 180 partially overlaps and connects to the drain electrode 162. In an alternative exemplary embodiment of the present invention, the pixel electrode 180 may include a slit pattern (not shown) as a domain partition portion used to control a direction in which liquid crystals (not shown) in the liquid crystal layer 300 are aligned. Alternatively, the pixel electrode 180 may include a protrusion pattern as the domain partition portion used to control the direction in which the liquid crystals are aligned. The slit pattern (not shown) of the pixel electrode 180 and a slit pattern (not shown) of the common electrode 240, which will be described in further detail below, may be used to partition the liquid crystal layer 300 into a plurality of domains.

The repair pattern 185 is formed when the pixel electrode 180 is formed. The repair pattern 185 may overlap the first gate line 110a which delivers a gate signal to an adjacent pixel region, e.g., to a pixel region above the pixel region connected to the second gate line 110b. That is, the repair pattern 185 is formed on the passivation layer 170 which is disposed above the overlapping region 112 of the first gate line 110a. Thus, the gate insulating film 130 and the passivation layer 170 are interposed between the repair pattern 185 and the first gate line 110a.

The repair pattern 185 according to an exemplary embodiment includes a plurality of connection patterns 185a. Each connection pattern 185a of the plurality of connection patterns 185a has a substantially rectilinear shape, and the connection patterns 185a are arranged at predetermined intervals and each have a same width, as shown in FIG. 4. Further, the connection patterns 185a of the repair pattern 185 may be arranged at regular, e.g., fixed, intervals and have the same width. Alternatively, the connection patterns 185a may be arranged at irregular, e.g., varying, intervals and may have different widths.

The repair pattern 185 is connected to the pixel electrode 180. More specifically, the connection patterns 185a of the repair pattern 185 extend from the pixel electrode 180 toward the overlapping region 112 of the first gate line 110a, as shown in FIG. 4. In an exemplary embodiment of the present invention in which the repair pattern 185 includes the connection patterns 185a arranged at predetermined intervals, have a predetermined width and are connected to, e.g., extend from, the pixel electrode 180 as described in greater detail above, an overlapping area of the first gate line 110a and the repair pattern 185 is significantly reduced. Consequently, a smaller amount (as compared to an LCD of the prior art) of additional capacitance, e.g., capacitance in addition to liquid crystal and/or storage capacitance, is created between the first gate line 110a and the repair pattern 185 in the LCD according to an exemplary embodiment of the present invention.

Specifically, a repair pattern of an LCD of the prior art protrudes from a pixel electrode and has a rectangle or square shape of a predetermined size, thereby causing an increase in additional capacitance as compared to the LCD according to an exemplary embodiment. In contrast, the repair pattern 185 according to an exemplary embodiment of the present invention includes the plurality of connection patterns 185a, each of which protrude separately from the pixel electrode 180, are arranged at predetermined intervals and have a predetermined width. In an exemplary embodiment of the present invention, intervals at which the connection patterns 185a are arranged and widths of the connection patterns 185a are such that an overlapping area of the repair pattern 185 and the first gate line 110a is less than a half of an overlapping area thereof in an LCD of the prior art. Accordingly, additional capacitance created between the repair pattern 185 and the first gate line 110a of the present invention is substantially less than additional capacitance created between the repair pattern and the gate line of the prior art.

The color filter substrate 200 includes a black matrix 220 formed on a second insulating substrate 210, and a color filter 230 formed between portions of the black matrix 220 and the common electrode 240 (which is formed on the black matrix 220 and the color filter 230).

As shown in FIG. 1, the black matrix 220 is formed between the pixel regions. Thus, the black matrix 220 prevents leakage of light to regions other than the pixel regions and also substantially reduces optical interference between adjacent pixel regions. In an exemplary embodiment of the present invention, the black matrix 220 is made of a photosensitive organic material to which a black pigment is added, for example. The black pigment may be carbon black or titanium oxide, but alternative exemplary embodiments are not limited thereto. For example, the black matrix 220 according to an alternative exemplary embodiment may be made of a metal material such as Cr or chromium oxide ("CrOx").

In an exemplary embodiment, red, green and blue color filters are alternately repeated between adjacent portions of the black matrix 220 to form the color filter 230. Thus, the color filter 230 adds color to light been irradiated by a light source and transmitted through the liquid crystal layer 300. The color filter 230 according to an exemplary embodiment may be made of a photosensitive organic material.

In an exemplary embodiment, the common electrode 240 is made of a transparent conductive material, such as indium tin oxide ("ITO") or indium zinc oxide ("IZO"), for example, and is formed on the black matrix 220 and the color filter 230. The common electrode 240 and the pixel electrode 180 of the TFT substrate 100 apply a voltage to the liquid crystal layer 300. A slit pattern (not shown) may be formed in the common electrode 240. Like the slit pattern (not shown) of the pixel electrode 180, the slit pattern (not shown) of the common electrode 240 may partition the liquid crystal layer 300 into a plurality of domains.

As described above, when the repair pattern 185 includes the plurality of connection patterns 185a connected to the pixel electrode 180, each arranged at predetermined intervals and having a predetermined width, the size of the repair pattern 185 is smaller than a size of a repair pattern of the prior art. Therefore, a smaller amount of additional capacitance is created between the repair pattern 185 and the first gate line 110a in the LCD according to an exemplary embodiment of the present invention than in an LCD of the prior art. Consequently, delay of a gate signal is substantially reduced, and deterioration of an image quality of the LCD is effectively prevented.

When a bright-spot defect occurs in a pixel, the drain electrode 162 of the TFT T in the pixel is opened, e.g., is open-circuited. Therefore, in the LCD according to an exemplary embodiment of the present invention, a laser beam is irradiated onto a region in which the repair pattern 185 is formed. Accordingly, an aperture is formed in the passivation layer 170 and the gate insulating film 130 in the region onto which the laser beam is irradiated, thereby exposing the overlapping region 112 of the first gate line 110a. Heat from the laser beam melts the repair pattern 185, and the melted repair pattern 185 flows into the aperture, thereby forming a short circuit between the repair pattern 185 and the first gate line 110a. In an exemplary embodiment of the present invention, an intense laser beam may be irradiated to only some of the connection patterns 185a of the repair pattern 185. Therefore, the pixel electrode 180 and the first gate line 110a associated with the pixel electrode 180 are short-circuited, and the pixel which previously had the bright-spot defect appears as a dark spot, thereby effectively repairing the bright-spot defect in the LCD according to an exemplary embodiment.

Figure 5:
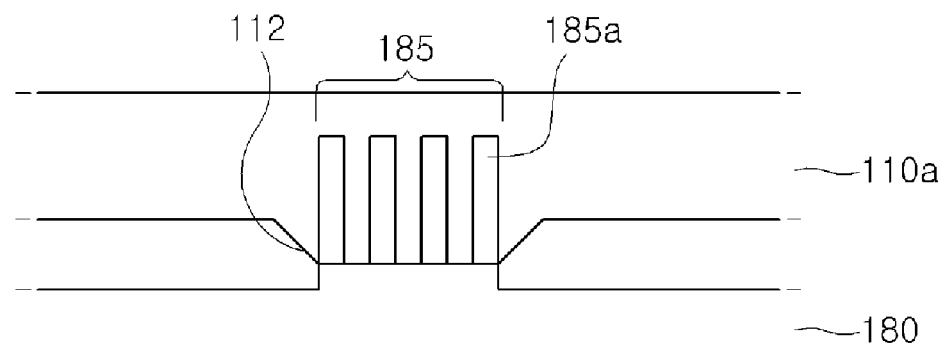
FIGS. 5 through 9 are enlarged views of portion A of FIG. 1 illustrating a repair pattern according to exemplary embodiments of the present invention.

In an exemplary embodiment, the repair pattern 185 includes the connection patterns 185a connected to the pixel electrode 180. Specifically, the repair pattern 185 extends from the pixel electrode 180 toward the first gate line 110a, as described above in greater detail. In alternative exemplary embodiments, the repair pattern 185 may have any shape, as long as it can be at least partially connected to the pixel electrode 180 and formed substantially above the overlapping region 112. For example, referring to FIG. 5, which is an enlarged view, from a cross-sectional perspective, of the portion A of FIG. 1 illustrating a repair pattern according to an alternative exemplary embodiment of the present invention, a portion of the pixel electrode 180 protrudes upward, e.g., away from the pixel electrode 180 toward the first gate line 110a to align with a lower side of the overlapping region 112 of the first gate line 110a which protrudes downward, e.g., away from the first gate line 110a toward the pixel electrode 180, as shown in FIG. 5. In addition, the repair pattern 185 including the connection patterns 185a may be aligned with the lower side of the overlapping region 112. Thus, the pixel electrode 180 and the repair pattern 185 are connected to each other at the lower side of the overlapping region 112.

It will be noted that alternative exemplary embodiments of the present invention are not limited to the foregoing description, as will now be described in further detail with reference to FIGS. 6 through 9, which are enlarged views of the portion A of FIG. 1 illustrating a repair pattern according to alternative exemplary embodiments of the present invention.

In an alternative embodiment of the present invention, for example, the repair pattern 185 is separate from, e.g., spaced apart from, the pixel electrode 180, as will now be described in further detail with reference to FIG. 6.

Figure 6:
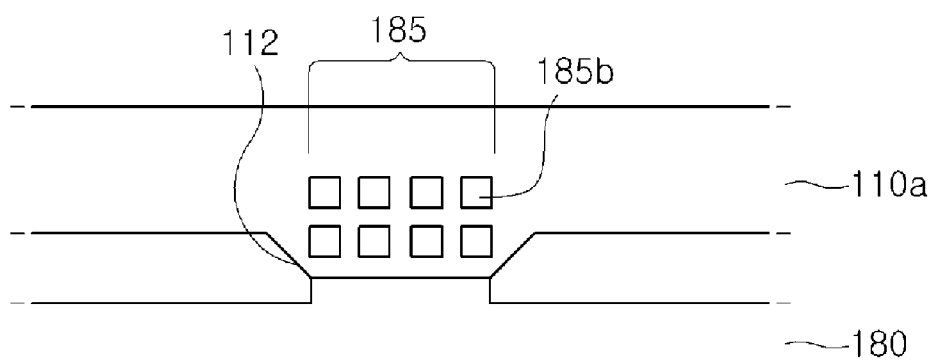

FIG. 6 is an enlarged view of a repair pattern 185 according to an exemplary embodiment of the present invention. As noted above, the schematic plan view of FIG. 6 corresponds to the enlarged view of the portion A shown in FIG. 1.

Referring to FIG. 6, a portion of a pixel electrode 180 protrudes upward to form a boundary with an overlapping region 112 of a first gate line 110a. The repair pattern 185 includes a plurality of separation patterns 185b formed above the overlapping region 112. Separation patterns 185b of the plurality of separation patterns 185b are shaped like islands, e.g., are substantially rectangular or square and are disposed adjacent to and spaced apart from one another in the overlapping region 112, as shown in FIG. 6. More specifically, the separation patterns 185b have a predetermined size and are arranged at predetermined intervals. In addition, the separation patterns 185b may be formed of various shapes. For example, the separation patterns 185b may be shaped like a square (as shown in FIG. 6), or, alternatively, may be circular or oval, for example, but alternative exemplary embodiments are not limited thereto. Further, the separation patterns 185b according to alternative exemplary embodiments may be arranged at regular intervals, as shown in FIG. 6, or, alternatively, may be arranged at irregular intervals.

A gap between adjacent separation patterns 185b may be equal to, or, alternatively, may be different from a gap between the separation patterns 185b and the pixel electrode 180. Further, the separation patterns 185b are formed adjacent to a lower side of the overlapping region 112 and are spaced apart from the pixel electrode 180 by a predetermined gap. In an exemplary embodiment of the present invention, the predetermined gap is sufficient to allow a short circuit to be formed between the separation patterns 185b and the pixel electrode 180 when the separation patterns 185b are melted by heat from a laser beam, as described in greater detail above.

When the repair pattern 185 includes the plurality of separation patterns 185b, a hole is formed in a gate insulating film 130 (FIGS. 2 and 3) and a passivation layer 170 between the repair pattern 185 and the first gate line 110a when a laser beam is irradiated onto a region in which the repair pattern 185 is formed. In addition, the repair pattern 185 is melted by the heat of the laser beam, and the melted repair pattern 185 flows into the hole to connect to, e.g., to short-circuit to, the first gate line 110a. Also, the melted separation patterns 185b, which are shaped like islands, short-circuit to each other and cause the pixel electrode 180 to short-circuit to the first gate line 110a.

Figure 7:
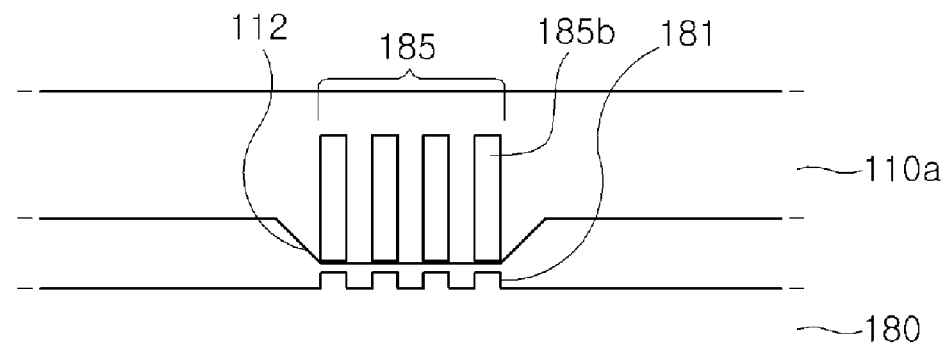

FIG. 7 is an enlarged view of a repair pattern 185 according to an alternative exemplary embodiment of the present invention. The schematic plan view of FIG. 7 corresponds to the enlarged view of the portion A shown in FIG. 1.

Referring to FIG. 7, a plurality of protrusions 181 are formed in a portion of a pixel electrode 180 which corresponds to an overlapping region 112 of a first gate line 110a. Protrusions 181 of the plurality of protrusions 181 each protrude from the pixel electrode 180, have a predetermined width and are arranged at predetermined intervals therebetween. In addition, the protrusions 181 of the pixel electrode 180 are spaced apart from the overlapping region 112 of the first gate line 110a by a predetermined gap. The repair pattern 185 is spaced apart from the pixel electrode 180 and includes a plurality of separation patterns 185b, each of which have a predetermined width and are arranged at predetermined intervals. Separation patterns 185b of the plurality of separation patterns 185b extend in the second direction and have a substantially rectangular shape, as shown in FIG. 7. Specifically, the separation patterns 185b according to an exemplary embodiment extend toward a lower side of the overlapping region 112 to align with the lower side of the overlapping region 112.

The protrusions 181 of the pixel electrode 180 are spaced apart from the separation patterns 185b by a gap sufficient to allow a short circuit to be formed between the separation patterns 185b and the pixel electrode 180 when the separation patterns 185b are melted. In addition, the protrusions 181 of the pixel electrode 180 face, e.g., are disposed opposite to, the separation patterns 185b of the repair pattern 185.

When the repair pattern 185 is formed as described above according to an exemplary embodiment of the present invention, a hole is formed in a gate insulating film 130 and a passivation layer 170 when a laser beam is irradiated onto a region in which the repair pattern 185 is formed. In addition, the repair pattern 185 is melted by heat from the laser beam, and the melted repair pattern 185 flows into the hole to short-circuit to the first gate line 110a. Also, the melted repair pattern 185 causes the pixel electrode 180, and more particularly, the protrusions 181 of the pixel electrode 180, to short-circuit to the first gate line 110a. Accordingly, the pixel electrode 180 and the first gate line 110a are short-circuited.

Figure 8:
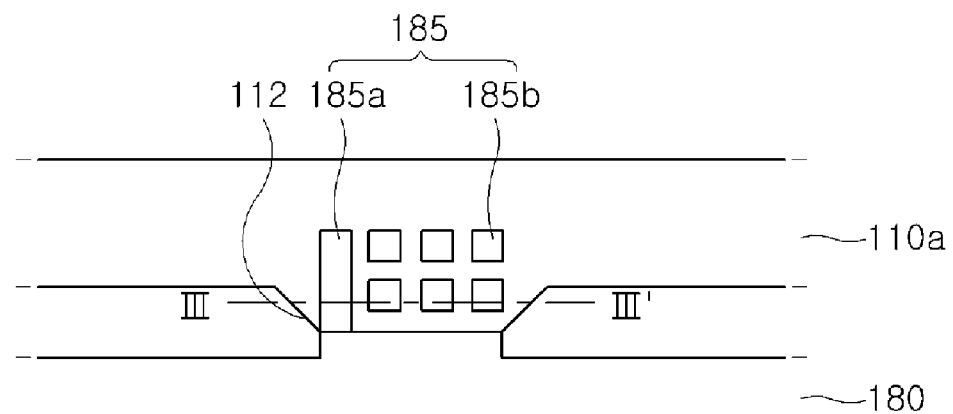

In alternative exemplary embodiments, shapes of the repair patterns 185 according to exemplary embodiments of the present invention as described above may be combined to form a repair pattern 185, as shown in FIGS. 8 and/or 9, and as will now be described in further detail.

Referring to FIG. 8, a portion of a pixel electrode 180 protrudes to form a boundary with an overlapping region 112 of a first gate line 110a, as described above in greater detail with reference to FIG. 7. The repair pattern 185 is formed above the overlapping region 112 and includes at least one connection pattern 185a and a plurality of separation patterns 185b. Thus, the connection pattern 185a having a predetermined width is connected to the protruding portion of the pixel electrode 180 and extends toward an upper side of the overlapping region 112 of the first gate line 110a. The separation patterns 185b are spaced apart from the connection pattern 185a and are also spaced apart from each other, as shown in FIG. 8. In addition, the separation patterns 185b are formed adjacent to a lower side, e.g., a side proximate to the pixel electrode 180, of the overlapping region 112 and are spaced apart from the pixel electrode 180 by a predetermined gap. In an exemplary embodiment, the predetermined gap is sufficient to allow a short circuit to be formed between the separation patterns 185b and the pixel electrode 180 when the separation patterns 185b are melted by heat from a laser beam.

Figure 9:
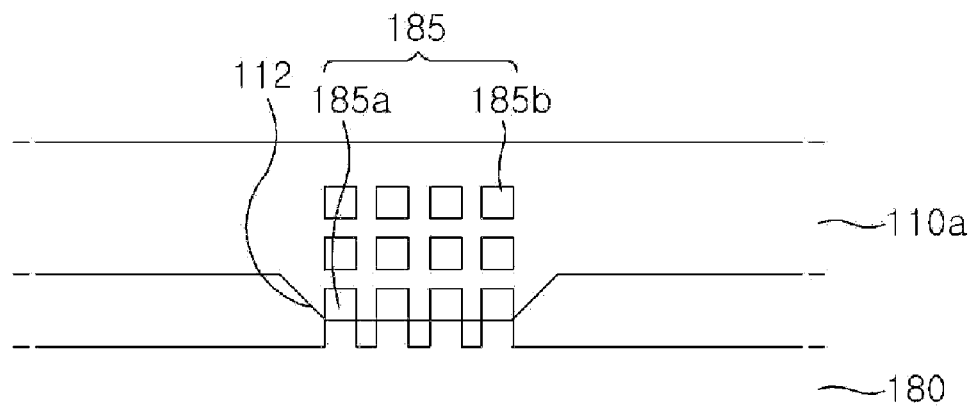

Referring to FIG. 9, the repair pattern 185 according to an alternative exemplary embodiment includes a plurality of connection patterns 185a and a plurality of separation patterns 185b. Connection patterns 185a of the plurality of connection patterns 185a protrude from a pixel electrode 180 to partially overlap an overlapping region 112 of a first gate line 110a. The connection patterns 185a have a predetermined width and are arranged at predetermined intervals. In addition, separation patterns 185b of the plurality of separation patterns 185b are spaced apart from the connection patterns 185a by a predetermined gap and are formed over the overlapping region 112. The separation patterns 185b face the connection patterns 185a and thus are arranged at substantially equal intervals as intervals of the connection patterns 185a.

In addition, the repair pattern 185 according to an exemplary embodiment of the present invention may be connected to part of the pixel electrode 180 and formed over the overlapping region 112 of the first gate line 110a and the repair pattern 185 may be spaced apart from the pixel electrode 180 by a predetermined gap and formed over the overlapping region 112 of the first gate line 110a to substantially reduce and/or effectively prevent additional capacitance from being created between the repair pattern 185 and the first gate line 110a.

Figure 10:
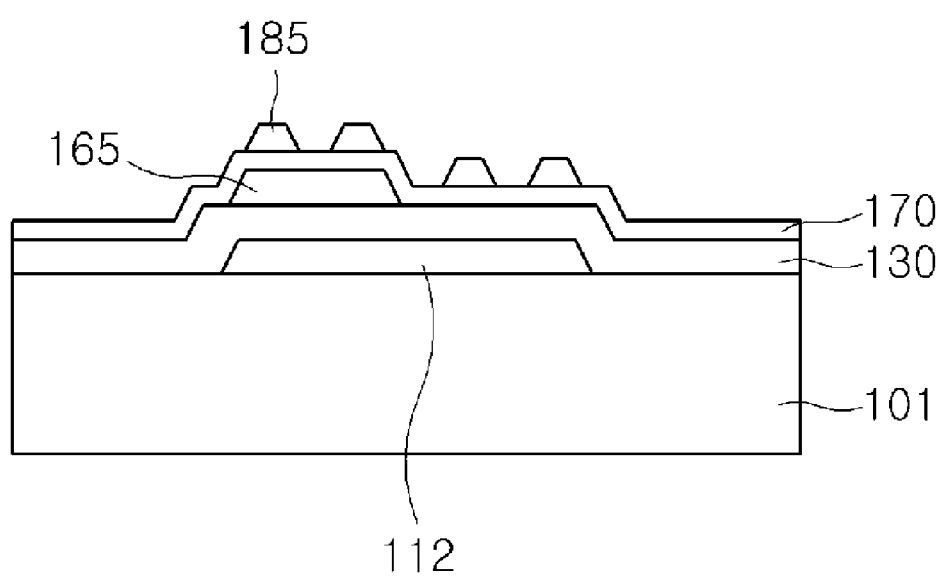
FIG. 10 is a partial cross-sectional view taken along line III-III' of FIG. 8.

According to the exemplary embodiment of the present invention described above, a gate insulating film 130 and a passivation layer 170 (FIGS. 2 and 3) are formed between the repair pattern 185 and the first gate line 110a. The gate insulating film 130 according to an exemplary embodiment is formed to a thickness of, for example, approximately 4000 Å, and the passivation layer 170 is formed to a thickness of, for example, approximately 2000 Å. Therefore, a hole may not be formed in the gate insulating film 130 and the passivation layer 170, when a laser beam is irradiated onto the gate insulating film 130 and the passivation layer 170. In order to prevent this situation, an exemplary embodiment of the present invention includes an auxiliary repair pattern 165 formed as shown in FIG. 10, which is a partial cross-sectional view taken along line III-III' of FIG. 8, to partially overlap the overlapping region 112 of the first gate line 110a. The auxiliary repair pattern 165 may be spaced apart from each of data lines 160 when the data lines 160 are formed.

The repair pattern 185 according to the exemplary embodiment of the present invention as described herein can be used in various display devices such as LCDs and plasma display panels ("PDPs"), for example, but not being limited thereto.

According to exemplary embodiments the present invention, a repair pattern is spaced apart from a pixel electrode and overlaps a preceding gate line. Thus, the repair pattern is connected to the pixel electrode when the repair pattern is melted by heat from a laser.

Alternatively, the repair pattern may be at least partially connected to the pixel electrode and overlap the preceding gate line. Since the repair pattern is spaced apart from or, alternatively, only partially connected to the pixel electrode, additional capacitance normally generated by overlapping of the repair pattern and the gate line is substantially reduced and/or effectively prevented in the LCD according to an exemplary embodiment of the present invention. Consequently, a delay of a gate signal and a resulting deterioration of an image quality is effectively prevented in the LCD according to an exemplary embodiment.

The exemplary embodiments of the present invention described herein should be considered in a descriptive sense only and not for purposes of limitation. Thus, the present invention should not be construed as being limited to the exemplary embodiments set forth herein. Rather, these exemplary embodiments are provided so that this disclosure will be thorough and complete and will fully convey the concept of the present invention to those skilled in the art While the present invention has been particularly shown and described with reference to exemplary embodiments thereof, it will be understood by those of ordinary skill in the art that various changes in form and detail may be made therein without departing from the spirit or scope of the present invention as defined by the following claims.

What is claimed is:

1. A thin-film transistor substrate comprising:
   gate lines which extend in a first direction, the gate lines including a first gate line and a second gate line, the first gate line disposed adjacent to and previous to the second gate line;
   data lines which are insulated from the gate lines and extend in a second direction perpendicular to the first direction;
   a pixel electrode formed in a region where the first gate line and the second gate line cross the data lines and connected to the second gate line;
   and a repair pattern which at least partially overlaps the first gate line,
   the repair pattern comprising a plurality of connection patterns, wherein
   the connection patterns extend from the pixel electrode on a same layer in the second direction toward the first gate line, the connection patterns at least partially connect the pixel electrode directly to the first gate line when the pixel electrode exhibits a bright-spot defect,
   each of the connection patterns have a predetermined width measured in the first direction, and are arranged at predetermined intervals along the first direction.

2. The thin-film transistor substrate of claim 1, wherein a width, measured in the second direction, of an overlapping region of the gate lines which overlaps the repair pattern is one of
   greater than a width, measured in the second direction, of a region of the gate lines which does not overlap the repair pattern, and
   less than the width, measured in the second direction, of the region of the gate lines which does not overlap the repair pattern.

3. The thin-film transistor substrate of claim 2, wherein the pixel electrode is aligned with a side of the overlapping region proximate to the first gate line.

4. The thin-film transistor substrate of claim 3, wherein a portion of the pixel electrode which is aligned with the overlapping region protrudes away from the pixel electrode toward the overlapping region.

5. The thin-film transistor substrate of claim 2, further comprising an auxiliary repair pattern, wherein
   the auxiliary repair pattern is formed between the overlapping region of the gate lines and the repair pattern,
   the auxiliary repair pattern is insulated from the overlapping region of the gate lines and the repair pattern, and
   the auxiliary repair pattern at least partially overlaps the overlapping region of the gate lines and the repair pattern.

6. The thin-film transistor substrate of claim 5, wherein the auxiliary repair pattern is formed in a same layer as the data lines.

7. A thin-film transistor substrate comprising:
   gate lines which extend in a first direction, the gate lines including a first gate line and a second gate line, the first gate line disposed adjacent to and previous to the second gate line;
   data lines which are insulated from the gate lines and extend in a second direction perpendicular to the first direction;
   a pixel electrode formed in a region where the first gate line and the second gate line cross the data lines and connected to the second gate line; and
   a repair pattern which is spaced apart from the pixel electrode on a same layer, the repair pattern comprising a plurality of separation patterns, the separation patterns at least partially connect the pixel electrode directly to the first gate line when the pixel electrode exhibits a bright-spot defect,
   each of the separation patterns have a predetermined width measured in the first direction, and are arranged spaced apart at predetermined intervals along the first direction in a plan view.

8. The thin-film transistor substrate of claim 7, wherein the separation pattern has a shape of island.

9. The thin-film transistor substrate of claim 7, wherein a width, measured in the second direction, of an overlapping region of the gate lines which overlaps the repair pattern is one of
- greater than a width, measured in the second direction, of a region of the gate lines which does not overlap the repair pattern, and
- less than the width, measured in the second direction, of the region of the gate lines which does not overlap the repair pattern.

10. The thin-film transistor substrate of claim 9, wherein the pixel electrode is spaced apart from the overlapping region of the gate lines.

11. The thin-film transistor substrate of claim 10, wherein a portion of the pixel electrode protrudes toward the overlapping region of the gate lines.

12. The thin-film transistor substrate of claim 9, further comprising an auxiliary repair pattern, wherein
- the auxiliary repair pattern is formed between the overlapping region of the gate lines and the repair pattern,
- the auxiliary repair pattern is insulated from the overlapping region of the gate lines and the repair pattern, and
- the auxiliary repair pattern at least partially overlaps the overlapping region of the gate lines and the repair pattern.

13. The thin-film transistor substrate of claim 12, wherein the auxiliary repair pattern is formed in a same layer as the data lines.

14. The thin-film transistor substrate of claim 7, wherein the repair pattern which at least partially overlaps the first gate line, the repair pattern comprising a plurality of patterns, wherein the patterns have a shape of connection patterns and separation patterns.

15. The thin-film transistor substrate of claim 14, wherein the connection pattern extends from the pixel electrode in the second direction toward the first gate line.

16. The thin-film transistor substrate of claim 14, wherein the separation patterns have a shape of island.

17. The thin-film transistor substrate of claim 14, wherein a width, measured in the second direction, of an overlapping region of the gate lines which overlaps the repair pattern is one of
- greater than a width, measured in the second direction, of a region of the gate lines which does not overlap the repair pattern, and
- less than the width, measured in the second direction, of the region of the gate lines which does not overlap the repair pattern.

18. The thin-film transistor substrate of claim 17, wherein the pixel electrode is partially spaced apart from the overlapping region of the gate lines.

19. The thin-film transistor substrate of claim 18, wherein a portion of the pixel electrode partially protrudes toward the overlapping region of the gate lines.

20. The thin-film transistor substrate of claim 17, further comprising an auxiliary repair pattern, wherein
- the auxiliary repair pattern is formed between the overlapping region of the gate lines and the repair pattern,
- the auxiliary repair pattern is insulated from the overlapping region of the gate lines and the repair pattern, and
- the auxiliary repair pattern at least partially overlaps the overlapping region of the gate lines and the repair pattern.

21. The thin-film transistor substrate of claim 20, wherein the auxiliary repair pattern is formed in a same layer as the data lines.

* * * * *